(12) United States Patent
Noda (10) Patent No.: US 7,098,681 B2
(45) Date of Patent: Aug. 29, 2006

(54) SEMICONDUCTOR DEVICE, METHOD FOR TESTING THE SAME AND IC CARD

(75) Inventor: Junichiro Noda, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 3 days.

(21) Appl. No.: 10/897,032

(22) Filed: Jul. 23, 2004

(65) Prior Publication Data

US 2005/0058006 A1 Mar. 17, 2005

(30) Foreign Application Priority Data

Jul. 24, 2003 (JP) ............................. P2003-201305

(51) Int. Cl.
*G01R 31/02* (2006.01)
(52) U.S. Cl. .................... 324/763; 324/158.1
(58) Field of Classification Search ................. 324/763
See application file for complete search history.

(56) References Cited

U.S. PATENT DOCUMENTS 5,705,934 A * 1/1998 Drouot ....................... 324/763

FOREIGN PATENT DOCUMENTS

| JP | 2000-40792 | 2/2000 |
|----|------------|--------|
| JP | 2001-101883 | 4/2001 |

* cited by examiner

*Primary Examiner*—Vinh Nguyen
*Assistant Examiner*—Russell M. Kobert
(74) *Attorney, Agent, or Firm*—Oblon, Spivak, McClelland, Maier & Neustadt, P.C.

(57) ABSTRACT

A semiconductor device has a boosting circuit configured to generate a boosting potential to an output line. An internal circuit is supplied with the boosting potential from the boosting circuit via the output line. A test line is connected to the output line. A control circuit is arranged between the output line and the test line and configured to shut off a current flowing into the test line from the output line during a boosting operation of the boosting circuit.

5 Claims, 7 Drawing Sheets

SEMICONDUCTOR DEVICE, METHOD FOR TESTING THE SAME AND IC CARD

CROSS REFERENCE TO RELATED APPLICATION

This application is based upon and claims the benefit of priority from the prior Japanese Patent Application No. JP2003-201305 filed on Jul. 24, 2003, the entire contents of which are incorporated herein by reference.

FIELD OF THE INVENTION

The present invention relates to a semiconductor device, method for testing the same, and an IC card, and more particularly relates to a semiconductor device including a booting circuit for supplying a high voltage, method for testing the same, and the IC card.

DESCRIPTION OF THE BACKGROUND

Rewrite of a nonvolatile memory such as an EEPROM is performed by applying a high voltage to a memory cell. Thus, the nonvolatile memory includes a boosting circuit for supplying a required high voltage to the memory cell. Moreover, in order to monitor a boosting potential of the boosting circuit and to evaluate a write margin of the memory cell in wafer inspection before dicing, an output line of the boosting circuit is often connected to a test pad.

This test pad is not used after the wafer inspection. Thus, in case that the nonvolatile memory is mounted on an integrated circuit card (IC card) having strict security restrictions and the like, the test pad is arranged on a dicing line and cut off along with dicing.

However, if the test pad is arranged on the dicing line, a metal wiring connected to the test pad may be short-circuited to ground potential by dicing. Thus, there is a possibility that the output line of the boosting circuit is grounded. When the output line of the boosting circuit is grounded, a leak current is caused. Thus, a possible lowering of a boosting voltage of the boosting circuit may result.

Based on the background as described above, a semiconductor device capable of removing the test pad without lowering the boosting voltage of the boosting circuit has been proposed. This conventional semiconductor device is described in Japanese Patent Publication (Kokai) No. 2000-40792.

Figure 7:
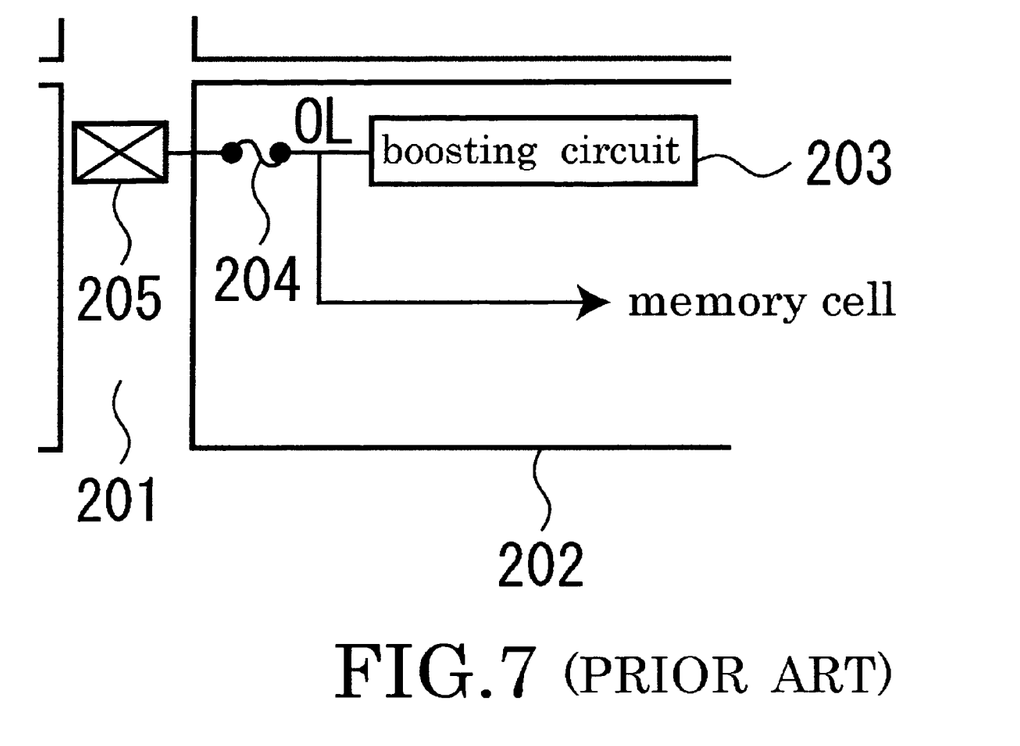
FIG. 7 is a circuit diagram showing a configuration of a conventional semiconductor device.

With reference to FIG. 7, description will be given of the conventional semiconductor device described above. FIG. 7 is a block diagram showing a structure of the conventional semiconductor device in its wafer state.

In a chip region 202 sectioned by a dicing line 201, a boosting circuit 203 and a fuse 204 are provided. An output line OL of the boosting circuit 203 is connected to a memory cell. Moreover, in order to monitor a boosting potential and evaluate a write margin of the memory cell in wafer inspection before dicing, the output line OL of the boosting circuit 203 is connected to a test pad 205, which is arranged on the dicing line 201, via the fuse 204.

When the test pad is no longer in use after the boosting potential is monitored and the write margin of the memory cell is evaluated, the fuse 204 is cut off by use of a laser and the like. By cutting off the fuse 204, the output line OL of the boosting circuit 203, which is connected to the test pad 205, is electrically isolated from the test pad 205. Thus, even if the output line OL of the boosting circuit 203 is grounded by dicing, lowering of the boosting voltage of the boosting circuit 203 can be prevented.

However, in the conventional semiconductor device, since the fuse 204 is cut off by use of the laser and the like, it is required to expose the fuse 204 in forming a protective film. Thus, in a spot where the fuse 204 is provided, the output line OL of the boosting circuit 203 is exposed to the surface. From the viewpoint of security, it is desirable that the output line OL of the boosting circuit 203 is not exposed to the surface.

Moreover, in the conventional semiconductor device, in order to electrically isolate the output line OL of the boosting circuit 203 and the test pad 205 from each other, it has been required to cut off the fuse 204 by use of the laser and the like. Thus, a conventional method for testing a semiconductor device has had to include the following steps. Specifically, after the boosting potential is monitored and the write margin of the memory cell is evaluated by a tester, a wafer is transferred to a fuse blow device to cut off the fuse 204. Thereafter, the wafer is transferred again to the tester and it is inspected whether or not the output line OL of the boosting circuit 203 is in its open state. As described above, by use of the conventional method for testing a semiconductor device, the steps in the wafer inspection become complicated. Thus, cost increase in testing has been a problem.

SUMMARY OF THE INVENTION

Accordingly, an object of the present invention is to provide a semiconductor device which prevents lowering of a boosting voltage of a boosting circuit, and an IC card while retaining security.

Moreover, another object of the present invention is to provide a method for testing a semiconductor device, which prevents lowering of a boosting voltage of a boosting circuit without cost increase in testing.

To that end, according to one aspect of the present invention there is provided a semiconductor device including a boosting circuit configured to generate a boosting potential and output the boosting potential to an output line, an internal circuit supplied with the boosting potential from the boosting circuit via the output line, a test line connected to the output line, and a control circuit arranged between the output line and the test line.

DETAILED DESCRIPTION OF THE INVENTION

Figure 1:
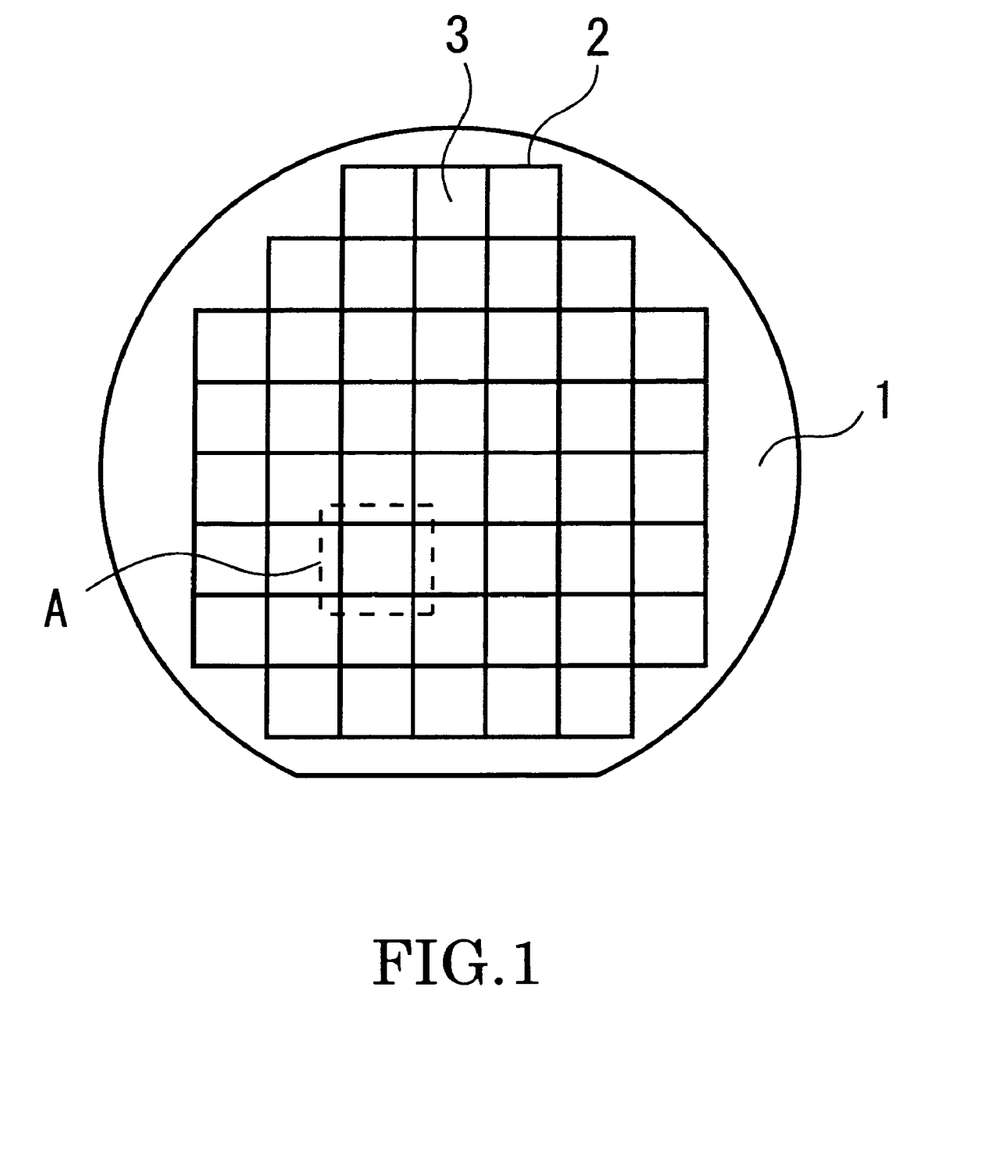
FIG. 1 is a plan view showing chip regions on a semiconductor wafer.
Figure 2:
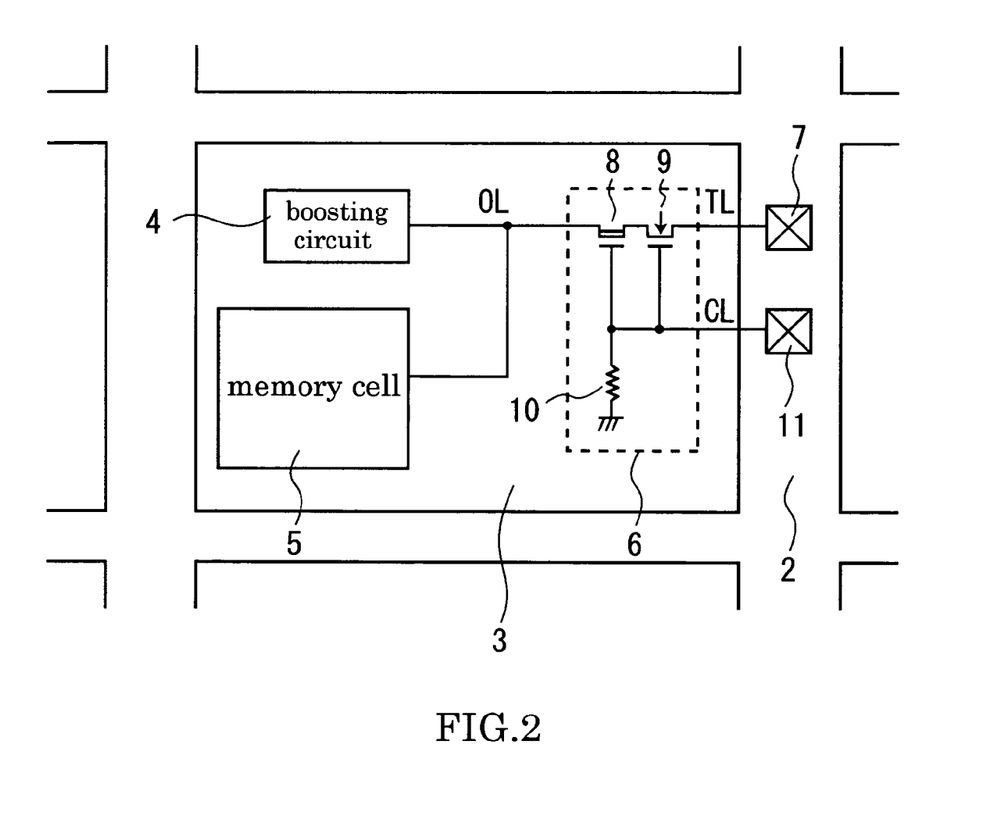
FIG. 2 is an enlarged circuit diagram of a region A surrounded by a broken line in FIG. 1, showing a configuration of the semiconductor device according to a first embodiment of the present invention in its wafer state.
Figure 3:
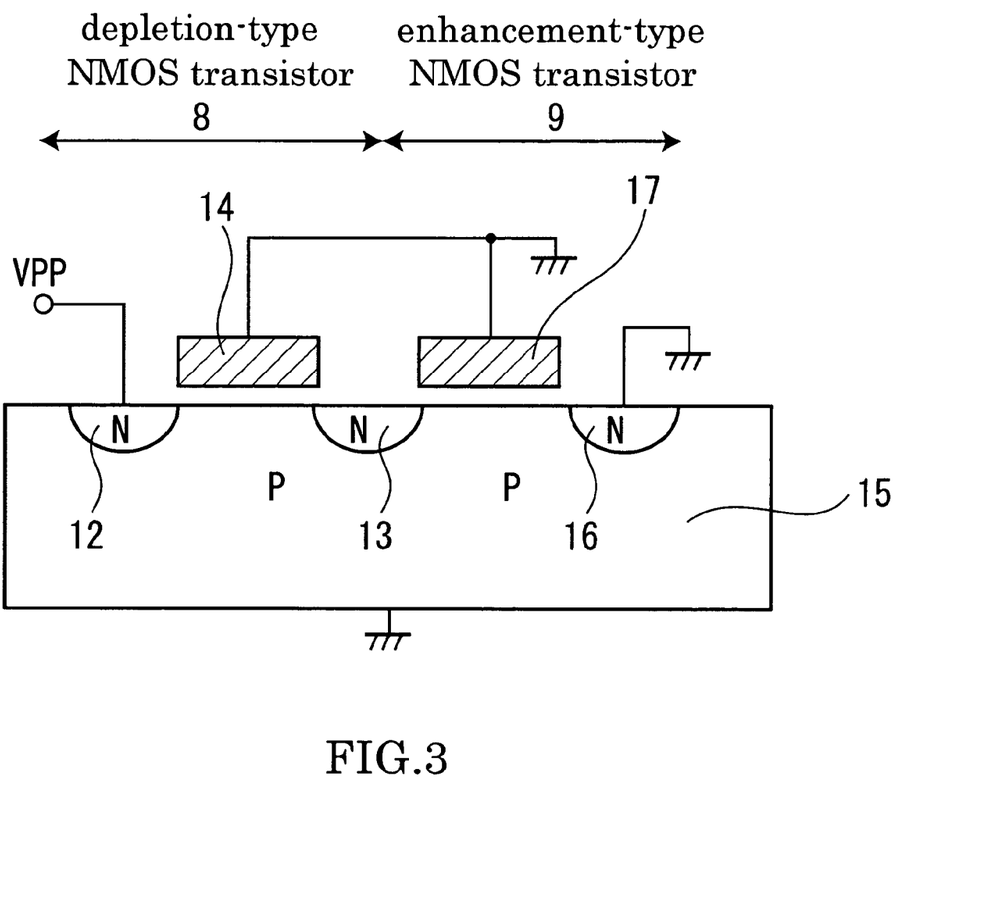
FIG. 3 is a cross-sectional view showing a structure of a control circuit used in the first embodiment of the present invention.

Referring now to the drawings, wherein like reference numerals designate the same or corresponding parts throughout the several views, FIGS. 1 to 3 illustrate a first embodiment of a semiconductor device and its test method according to the present invention.

First, with reference to FIGS. 1 and 2, the semiconductor device according to this embodiment will be described. FIG. 1 shows chip regions on a semiconductor wafer. FIG. 2 is an enlarged view of a region A surrounded by a broken line in FIG. 1, showing a configuration of the semiconductor device according to this embodiment in its wafer state.

On a semiconductor wafer 1, a plurality of chip regions 3 sectioned by a dicing line 2 are orderly arranged. In each of the chip regions 3, a boosting circuit 4 and a memory cell 5 are provided. The boosting circuit 4 generates a boosting voltage VPP and outputs the boosting voltage VPP to an output line OL. The boosting voltage VPP outputted from this output line OL is supplied to the memory cell 5 that is an internal circuit. The memory cell 5 is, for example, a memory cell of a nonvolatile memory such as an EEPROM. The memory cell 5 performs rewrite of data by applying the boosting voltage VPP to a word line and the like.

Moreover, in order to monitor the boosting voltage VPP and evaluate a write margin of the memory cell 5 in wafer inspection before dicing, the output line OL of the boosting circuit 4 is connected to a test line TL via a control circuit 6. Moreover, the test line TL is connected to a test pad 7. This test pad 7 is arranged on the dicing line 2 and cut off by dicing.

During the wafer inspection, the control circuit 6 allows the output line OL of the boosting circuit 4 and the test line TL to be conducted due to supply of a voltage to a control pad 11. Moreover, during a boosting operation of the boosting circuit 4 after dicing, the control circuit 6 shuts off a current flowing into the test line TL from the output line OL of the boosting circuit 4. Specifically, during the boosting operation of the boosting circuit 4 after dicing, the control circuit 6 electrically isolates the output line OL of the boosting circuit 4 and the test line TL from each other.

Next, a concrete configuration of the control circuit 6 will be described. The control circuit 6 includes a depletion-type NMOS transistor 8, an enhancement-type NMOS transistor 9 and a resistor 10. The depletion-type NMOS transistor 8 and the enhancement-type NMOS transistor 9 are serially connected to each other. A drain of the depletion-type NMOS transistor 8 is connected to the output line OL of the boosting circuit 4 and a source of the enhancement-type NMOS transistor 9 is connected to the test line TL. Moreover, gates of the depletion-type NMOS transistor 8 and the enhancement-type NMOS transistor 9 are grounded via the resistor 10. Furthermore, the gates of the depletion-type NMOS transistor 8 and the enhancement-type NMOS transistor 9 are connected to a control line CL. Moreover, the control line CL is connected to the control pad 11. This control pad 11 is also provided on the dicing line 2 similar to the test pad 7 and cut off by dicing.

Moreover, after dicing, the gates of the depletion-type NMOS transistor 8 and the enhancement-type NMOS transistor 9 are grounded via the resistor 10. Accordingly, the enhancement-type NMOS transistor 9 is turned off. Thus, the output line OL of the boosting circuit 4 and the test line TL are electrically isolated from each other.

Next, with reference to FIG. 3, description will be given of an operation of the control circuit 6 according to this embodiment. FIG. 3 is a cross-sectional view showing a structure of the control circuit 6.

The depletion-type NMOS transistor 8 includes N-type diffusion layers 12 and 13 and a gate electrode 14. The N-type diffusion layers 12 and 13 are provided in an upper portion of a P-type silicon substrate 15 with a space therebetween. Moreover, on the P-type silicon substrate 15 between the N-type diffusion layers 12 and 13, the gate electrode 14 is provided with a gate insulating film (not shown) interposed therebetween. This N-type diffusion layer 12 is a drain layer of the depletion-type NMOS transistor 8. On the other hand, the N-type diffusion layer 13 is a source layer of the depletion-type NMOS transistor 8. Moreover, the N-type diffusion layer 12 is connected to the output line OL of the boosting circuit 4 and the boosting voltage VPP is applied thereto during the boosting operation of the boosting circuit 4. Furthermore, the gate electrode 14 and the P-type silicon substrate 15 are grounded.

The enhancement-type NMOS transistor 9 includes the N-type diffusion layer 13, a N-type diffusion layer 16 and a gate electrode 17. The N-type diffusion layer 16 is provided in the upper portion of the P-type silicon substrate 15 with a space from the N-type diffusion layer 13. Moreover, on the P-type silicon substrate 15 between the N-type diffusion layers 13 and 16, the gate electrode 17 is provided with a gate insulating film (not shown) interposed therebetween. This N-type diffusion layer 13 is a drain layer of the enhancement-type NMOS transistor 9 as well as the source layer of the depletion-type NMOS transistor 8. On the other hand, the N-type diffusion layer 16 is a source layer of the enhancement-type NMOS transistor 9. Moreover, the N-type diffusion layer 16 is connected to the test line TL. FIG. 3 shows the case where the test pad 7 is cut off by dicing and the test line TL is grounded. Furthermore, the gate electrode 17 is grounded.

Here, description will be given of a case where, after the test line TL is grounded by dicing, the boosting voltage VPP is applied to the N-type diffusion layer 12 from the boosting circuit 4 via the output line OL.

Since the gate electrode 14 of the depletion-type NMOS transistor 8 is grounded, the depletion-type NMOS transistor 8 is turned on until a voltage between gate and source of the depletion-type NMOS transistor 8 is set to around −VthD. Specifically, the depletion-type NMOS transistor 8 is turned on until a potential of the N-type diffusion layer 13 is set to around a threshold voltage VthD. Thus, during the boosting operation of the boosting circuit 4, the potential of the N-type diffusion layer 13 is set to around the threshold voltage VthD of the depletion-type NMOS transistor 8.

Moreover, a parasitic PN diode is formed of the P-type silicon substrate 15 and the N-type diffusion layer 12. During the boosting operation of the boosting circuit 4, the boosting voltage VPP is applied to this parasitic PN diode in a reverse bias direction. When the boosting voltage VPP is high, impact ionization is caused by electric field concentration on a boundary between the P-type silicon substrate 15 and the N-type diffusion layer 12. Accordingly, electrons generated by this impact ionization are attracted toward the N-type diffusion layer 12 and holes flow into the P-type silicon substrate 15. Thus, a current flows between the N-type diffusion layer 12 and the P-type silicon substrate 15. This occurrence of the current due to the impact ionization in the vicinity of the drain is called surface breakdown.

When the surface breakdown occurs, a potential of the P-type silicon substrate 15 rises in response to a voltage drop due to resistance of the P-type silicon substrate 15. In this event, if the potential of the N-type diffusion layer 13 is low, a parasitic bipolar transistor including the N-type diffusion layers 12 and 13 and the P-type silicon substrate 15 is conducted. When the parasitic bipolar transistor is conducted, a large current flows between the N-type diffusion layers 12 and 13 and an element may be destroyed. However, in the control circuit 6 shown in FIG. 3, the potential of the N-type diffusion layer 13 is about the threshold voltage VthD of the depletion-type NMOS transistor 8. Thus, even if the potential of the P-type silicon substrate 15 rises, a voltage in a forward bias direction is not applied to the parasitic PN diode including the N-type diffusion layer 13 and the P-type silicon substrate 15. Thus, the parasitic bipolar transistor including the N-type diffusion layers 12 and 13 and the P-type silicon substrate 15 is never conducted.

Moreover, the threshold voltage VthD of the depletion-type NMOS transistor 8 is set to be such a value that the surface breakdown is not caused in the enhancement-type NMOS transistor 9. Thus, the current flowing into the test line TL from the output line OL of the boosting circuit 4 is shut off and the output line OL of the boosting circuit 4 and the test line TL are electrically isolated from each other.

In the semiconductor device according to this embodiment described above, the control circuit 6 is provided between the output line OL of the boosting circuit 4 and the test line TL. This control circuit 6 shuts off the current flowing into the test line TL from the output line OL of the boosting circuit 4 during the boosting operation of the boosting circuit 4 after dicing. Thus, in the semiconductor device according to this embodiment, the output line OL of the boosting circuit 4 is not exposed to the surface in order to electrically isolate the output line OL of the boosting circuit 4 and the test line TL from each other. Consequently, the semiconductor device according to this embodiment can prevent the boosting voltage VPP of the boosting circuit 4 from lowering while retaining security.

Moreover, in the semiconductor device according to this embodiment, the depletion-type NMOS transistor 8 is provided in the control circuit 6. Accordingly, the boosting voltage VPP is not directly applied to the drain of the enhancement-type NMOS transistor 9. Thus, when the boosting voltage VPP is high, the semiconductor device according to this embodiment can prevent conduction of the parasitic bipolar transistor due to the surface breakdown.

Next, description will be given of a method for testing the semiconductor device according to this embodiment shown in FIG. 2.

First, a voltage is applied to the gates of the depletion-type NMOS transistor 8 and the enhancement-type NMOS transistor 9 via the control pad 11 so that a voltage between gate and source of the enhancement-type NMOS transistor 9 is not less than a threshold voltage VthE of the enhancement-type NMOS transistor 9. Accordingly, the enhancement-type NMOS transistor 9 is turned on. Specifically, a voltage is supplied to the control circuit 6 via the control pad 11 to allow the test pad 7 and the output line OL to be conducted.

Next, in the case of monitoring the boosting voltage VPP in the wafer inspection before dicing in the state where the test pad 7 and the output line OL are connected with each other, the voltage of the boosting voltage VPP applied to the test pad 7 is measured. Meanwhile, in the case of evaluating the write margin of the memory cell 5, a voltage is supplied to the word line and the like in the memory cell 5 via the test pad 7. Thereafter, data is read from the memory cell 5 and it is inspected whether or not data is rewritten by the supply of the voltage to the word line and the like.

The method for testing a semiconductor device according to this embodiment described above is not required to include a new step in the wafer inspection in order to set the output line OL of the boosting circuit 4 and the test line TL in an unconnected state. Thus, the method for testing a semiconductor device according to this embodiment can prevent the boosting voltage VPP of the boosting circuit 4 from lowering without increasing the number of steps in the wafer inspection.

Note that, in this embodiment, the memory cell 5 is described as the internal circuit to which the boosting circuit 4 supplies the boosting voltage VPP. However, this internal circuit is not limited to the memory cell.

Moreover, in this embodiment, the source of the depletion-type NMOS transistor 8 and the drain of the enhancement-type NMOS transistor 9 are in the same layer (the N-type diffusion layer 13). However, there is no limitation in this regard. As long as the source of the depletion-type NMOS transistor 8 and the drain of the enhancement-type NMOS transistor 9 are connected to each other, the source of the depletion-type NMOS transistor 8 and the drain of the enhancement-type NMOS transistor 9 do not always have to be in the same layer (the N-type diffusion layer 13).

Figure 4:
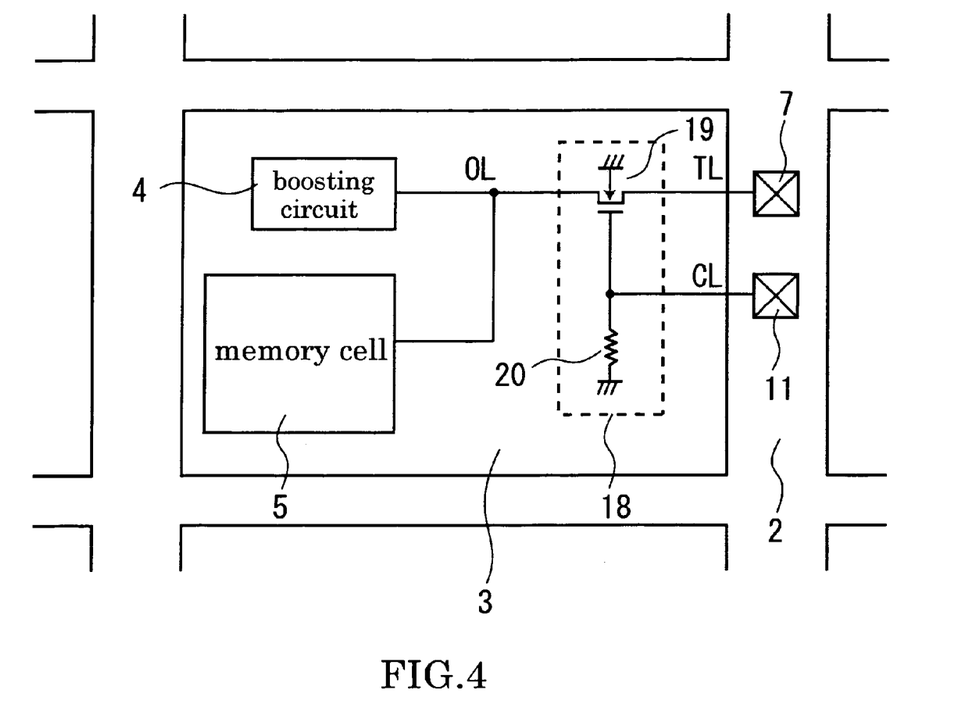
FIG. 4 is a circuit diagram showing a configuration of the semiconductor device according to a second embodiment of the present invention in its wafer state.

Next, with reference to FIG. 4, description will be given of a second embodiment of a semiconductor device and its test method according to the present invention. FIG. 4 is a circuit diagram showing a configuration of the semiconductor device according to this embodiment in its wafer state. The semiconductor device according to this embodiment is obtained by simplifying the circuit configuration of the control circuit 6 when the boosting voltage VPP is so low as not to cause the surface breakdown. Thus, portions common to those of the configuration of the semiconductor device according to the first embodiment described in reference to FIG. 2 are denoted by the same reference numerals in FIG. 4 and description thereof is omitted.

A control circuit 18 includes an enhancement-type NMOS transistor 19 and a resistor 20. A drain of the enhancement-type NMOS transistor 19 is connected to the output line OL of the boosting circuit 4 and a source thereof is connected to the test line TL. Moreover, a gate of the enhancement-type NMOS transistor 19 is grounded via the resistor 20. Furthermore, the gate of the enhancement-type NMOS transistor 19 is connected to the control line CL and this control line CL is connected to the control pad 11.

Moreover, after dicing, the gate of the enhancement-type NMOS transistor 19 is grounded via the resistor 20. As a result, the enhancement-type NMOS transistor 19 is turned off and the output line OL of the boosting circuit 4 and the test line TL are electrically isolated from each other.

In the semiconductor device according to this second embodiment, the control circuit 18 provided between the output line OL of the boosting circuit 4 and the test line TL shuts off the current flowing into the test line TL from the output line OL of the boosting circuit 4 during the boosting operation of the boosting circuit 4 after dicing. Thus, in the second embodiment, the output line OL of the boosting circuit 4 is not exposed to the surface in order to electrically isolate the output line OL of the boosting circuit 4 and the test line TL from each other. Consequently, similar to the first embodiment, the semiconductor device according to this embodiment can prevent the boosting voltage VPP of the boosting circuit 4 from lowering while retaining security.

Next, description will be given of a method for testing the semiconductor device according to this embodiment shown in FIG. 4.

First, a voltage is applied to the gate of the enhancement-type NMOS transistor 19 via the control pad 11 so that a voltage between gate and source of the enhancement-type NMOS transistor 19 is not less than a threshold voltage VthE of the enhancement-type NMOS transistor 19. Accordingly, the enhancement-type NMOS transistor 19 is turned on. Specifically, a voltage is supplied to the control circuit 18 via the control pad 11 to allow the test pad 7 and the output line OL to be conducted.

Next, in the case of monitoring the boosting voltage VPP in the wafer inspection before dicing in the state where the test pad 7 and the output line OL are conducted, the voltage of the boosting voltage VPP applied to the test pad 7 is measured. Meanwhile, in the case of evaluating the write margin of the memory cell 5, a voltage is supplied to the word line and the like in the memory cell 5 via the test pad 7. Thereafter, data is read from the memory cell 5 and it is inspected whether or not data is rewritten by the supply of the voltage to the word line and the like.

Similar to the first embodiment, the method for testing a semiconductor device according to the second embodiment described above is not required to include a new step in the wafer inspection in order to electrically isolate the output line OL of the boosting circuit 4 and the test line TL from each other. Thus, similar to the first embodiment, the method for testing a semiconductor device according to this embodiment can prevent the boosting voltage VPP of the boosting circuit 4 from lowering without increasing the number of steps in the wafer inspection.

In the second embodiment, the memory cell 5 is described as the internal circuit to which the boosting circuit 4 supplies the boosting voltage VPP. However, similar to the first embodiment, this internal circuit is not limited to the memory cell.

In the first and second embodiments of the present invention, various application examples are possible. As one of these application examples, with reference to FIGS. 5 and 6, description will be given of an IC (interface circuit) card to which the semiconductor device according to the first and second embodiments of the present invention is applied.

Figure 5:
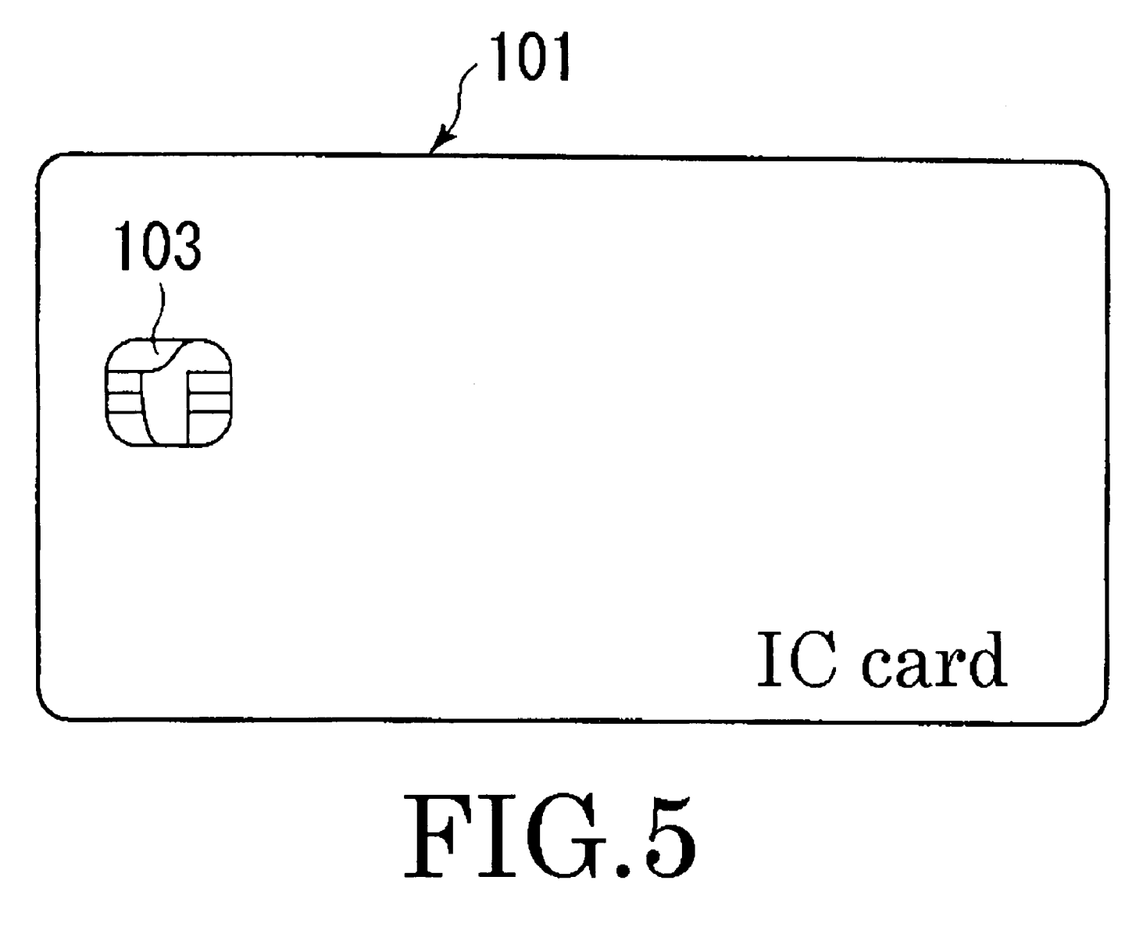
FIG. 5 is an illustration of an external configuration of an IC card to which the semiconductor device according to the first and second embodiments of the present invention is applied.
Figure 6:
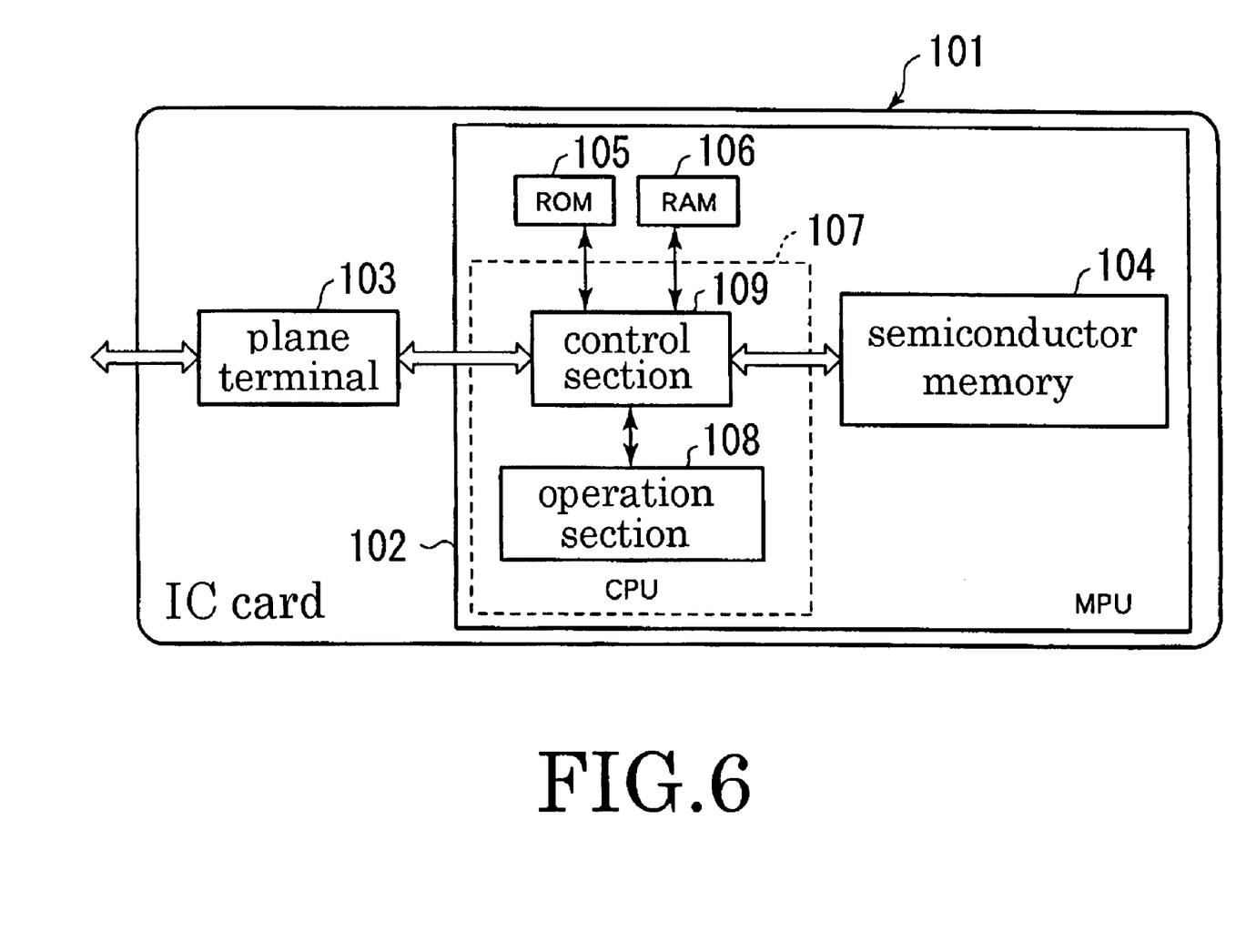
FIG. 6 is a circuit diagram showing an internal configuration of an IC card to which the semiconductor device according to the first and second embodiments of the present invention is applied.

An IC card 101 includes a MPU 102 and a plane terminal 103. The MPU 102 and the plane terminal 103 are connected to each other in the IC card 101. The MPU 101 includes a semiconductor memory 104, a ROM 105, a RAM 106 and a CPU 107. Moreover, the CPU 107 includes an operation section 108 and a control section 109. The control section 109 is connected to the semiconductor memory 104, the ROM 105 and the RAM 106. It is desirable that the MPU 101 is molded on one of surfaces of the IC card 101 and the plane terminal 103 is formed on the other surface of the IC card 101. In FIG. 6, the semiconductor device according to the first and second embodiments of the present invention can be applied to the semiconductor memory 104 or the ROM 105.

As described in the first and second embodiments, the semiconductor device of the present invention can prevent the boosting voltage VPP of the boosting circuit 4 from lowering while retaining the security. Thus, if the semiconductor device of the present invention is applied to the IC card, it is possible to provide an IC card with improved reliability in terms of security than an IC card to which the conventional semiconductor device is applied.

Other embodiment of the present invention will be apparent to those skilled in the art from consideration of the specification and practice of the invention disclosed herein. It is intended that the specification and example embodiment be considered as exemplary only, with a true scope and spirit of the invention being indicated by the following.

What is claimed is:

1. A semiconductor device comprising:
   a boosting circuit configured to generate a boosting potential and output the boosting potential to an output line;
   an internal circuit supplied with the boosting potential from the boosting circuit via the output line;
   a test line connected to the output line; and
   a control circuit arranged between the output line and the test line, the control circuit including,
   a first transistor including a first drain connected to the output line, a first source, and a first gate grounded via a resistor,
   a second transistor including a second drain connected to the first source, a second source connected to the test line, and a second gate grounded via the resistor; and
   a control line connected to the first gate and the second gate.

2. The semiconductor device according to claim 1, wherein the first transistor is a depletion-type NMOS transistor and the second transistor is an enhancement-type NMOS transistor.

3. The semiconductor device according to claim 2, further comprising:
   a test pad connected to the test line; and
   a control pad connected to the control line.

4. The semiconductor device according to claim 3, wherein the test pad and the control pad are arranged on a dicing line sectioning chip regions.

5. The semiconductor device according to claim 4, wherein the internal circuit comprises a memory cell of a nonvolatile memory device.

* * * * *